United States Patent
Yamauchi et al.

(10) Patent No.: US 6,528,382 B2
(45) Date of Patent: Mar. 4, 2003

(54) SEMICONDUCTOR DEVICE AND METHOD FOR FABRICATING THE SAME

(75) Inventors: Tsunenori Yamauchi; Hiroshi Kaneta; Katsuhiro Homma, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/883,393

(22) Filed: Jun. 19, 2001

(65) Prior Publication Data

US 2002/0064923 A1 May 30, 2002

(30) Foreign Application Priority Data

Nov. 28, 2000 (JP) .......................... 2000-361526

(51) Int. Cl.$^7$ ............................... H01L 21/20
(52) U.S. Cl. ................. 438/381; 438/238; 257/531; 257/277
(58) Field of Search ................ 438/381, 238; 257/531, 277

(56) References Cited

U.S. PATENT DOCUMENTS 5,622,886 A * 4/1997 Allum et al. ............... 438/238

2001/0023111 A1 * 9/2001 Yuan .......................... 438/439

FOREIGN PATENT DOCUMENTS

| EP | 0932204 | * 7/1999 |
|---|---|---|
| JP | 8-148501 | 6/1996 |
| JP | 2000-22085 | 1/2000 |

* cited by examiner

*Primary Examiner*—Trung Dang
(74) *Attorney, Agent, or Firm*—Armstrong, Westerman & Hattori, LLP

(57) ABSTRACT

A semiconductor device comprises a silicon substrate 10 of a resistivity above or equal to 800 Ω·cm and an oxygen concentration under or equal to $5 \times 10^{17}$ cm$^{-3}$, and an inductor 32b formed in the silicon substrate. A concentration of oxygen contained in the silicon substrate is set to be low, whereby the silicon substrate is less vulnerable to thermal donor effect, and even in a case that a silicon substrate of high resistivity is used, a semiconductor device which suppresses conversion of a conduction type of the silicon substrate while having an inductance of high Q. It is not necessary to bury a highly resistive layer in the silicon substrate, whereby a semiconductor device having an inductance of high Q can be fabricated by simple fabrication steps, which contributes to cost reduction of the semiconductor device.

15 Claims, 13 Drawing Sheets

SEMICONDUCTOR DEVICE AND METHOD FOR FABRICATING THE SAME

BACKGROUND OF THE INVENTION

The present invention relates to a semiconductor device and a method for fabricating the semiconductor device, more specifically to a semiconductor device including an inductor and a method for fabricating the semiconductor device.

LSIs which process signals of radio-frequencies of an about 2 GHz band effectively include inductors formed in the semiconductor chips so as to process signals of a wide frequency band.

FIG. 12 is a conceptual view of a conventional semiconductor device including an inductor.

A MOSFET, etc. not shown are formed on a p type silicon substrate 110. An insulation film 128 is formed on the silicon substrate 110 with the MOSFET, etc. formed on. An inductor 132b is formed on the insulation film 128. Bonding wires 138 are connected to the inductor 132b.

Thus, the conventional semiconductor device with the inductor 132b is formed.

In the semiconductor device shown in FIG. 12 large eddy current as shown in FIG. 12 is generated in the silicon substrate 110 below the inductor 132b. An eddy current loss lowers Q of the inductor 132b by 3 to 8.

Q of the inductor is an index which indicates low-loss and sharp resonance characteristics. Recently, Q is required to be above 20.

To improve Q of the inductor, the semiconductor device as shown in FIG. 13 is proposed. FIG. 13 is a conceptual view of the proposed semiconductor device.

As shown in FIG. 13, a plurality of trenches 112 are formed in a p type silicon substrate 110. A highly resistive layer 114 of polysilicon is buried in the trenches 112. An insulation film 128 is formed on the silicon substrate 110 with the highly resistive layer 114 buried in. An inductor 132b is formed on the insulation film 128.

In such semiconductor device, the highly resistive layer 114 is buried in the silicon substrate 110 to thereby increase a resistivity below the inductor 132b, whereby an eddy current loss can be smaller, and Q of the inductor 132b can be improved.

However, in the proposed semiconductor device shown in FIG. 13, it is necessary to form the trenches 112 in the silicon substrate 110, and the highly-resistive layer 114 is buried in the trenches 112. The proposed semiconductor device has a larger number of fabrication steps by about 10 steps in comparison with the semiconductor device shown in FIG. 12. Such increase of fabrication steps leads to higher costs of the semiconductor device. A technique for increasing Q of the inductor without burying the highly resistive layer in the silicon substrate has been required.

SUMMARY OF THE INVENTION

An object of the present invention is to provide a semiconductor device and a method for fabricating the semiconductor device which can form an inductor of high Q by simple steps.

According to one aspect of the present invention, there is provided a semiconductor device comprising: a silicon substrate of a resistivity above or equal to 800 Ω·cm and an oxygen concentration under or equal to $5 \times 10^{17}$ cm$^{-3}$; and an inductor formed in the silicon substrate. A concentration of oxygen contained in the silicon substrate is set to be low, whereby the silicon substrate is less vulnerable to thermal donor effect, and even in a case that a silicon substrate of high resistivity is used, a semiconductor device which suppresses conversion of a conduction type of the silicon substrate while having an inductance of high Q. It is not necessary to bury a highly resistive layer in the silicon substrate, whereby a semiconductor device having an inductance of high Q can be fabricated by simple fabrication steps, which contributes to cost reduction of the semiconductor device.

According to another aspect of the present invention, there is provided a method for fabricating a semiconductor device comprising: the step of forming an inductor in a silicon substrate of a resistivity above or equal to 800 Ω·cm and an oxygen concentration under or equal to $5 \times 10^{17}$ cm$^{-3}$. A concentration of oxygen contained in the silicon substrate is set to be low, whereby the silicon substrate is less vulnerable to thermal donor effect, and even in a case that a silicon substrate of high resistivity is used, a semiconductor device which suppresses conversion of a conduction type of the silicon substrate while having an inductance of high Q. It is not necessary to bury a highly resistive layer in the silicon substrate, whereby a semiconductor device having an inductance of high Q can be fabricated by simple fabrication steps, which contributes to cost reduction of the semiconductor device.

As described above, according to the present invention, a concentration of oxygen contained in a silicon substrate is set low, whereby the silicon substrate can be made invulnerable to the thermal donor phenomena. Even in a case that a p type silicon substrate of high resistivity is used, the conversion of the conduction type of the p type silicon substrate to n type can be prevented. Thus, according to the present invention, the conduction type of the p type silicon substrate is prevented from converting to n type, and the semiconductor device can include the inductor of high Q.

According to the present invention, because of the polysilicon film formed on the underside of the silicon substrate, which functions as the gettering site, even in a case that the silicon substrate has a low oxygen concentration, metal impurities can be trapped. Thus, according to the present invention, the semiconductor device can prevent characteristic from being degraded even in a case that the silicon substrate has a low oxygen concentration.

According to the present invention, because a highly resistive layer is buried in the silicon substrate, the inductor of high Q can be formed by simple steps, which much contributes to lower costs of the semiconductor device.

According to the present invention, the epitaxial layer is formed on the silicon substrate, and the p-channel MOSFET and the n-channel MOSFET a: e formed on the epitaxial layer, whereby the device isolation can be easily performed without forming a channel stop region.

BRIEF DESCRIPTION OF THE-DRAWINGS

DETAILED DESCRIPTION OF THE INVENTION

A First Embodiment

Before the semiconductor device according to a first embodiment of the present invention and a method for fabricating the semiconductor device are explained, the principle of the present invention will be explained.

Figure 2:
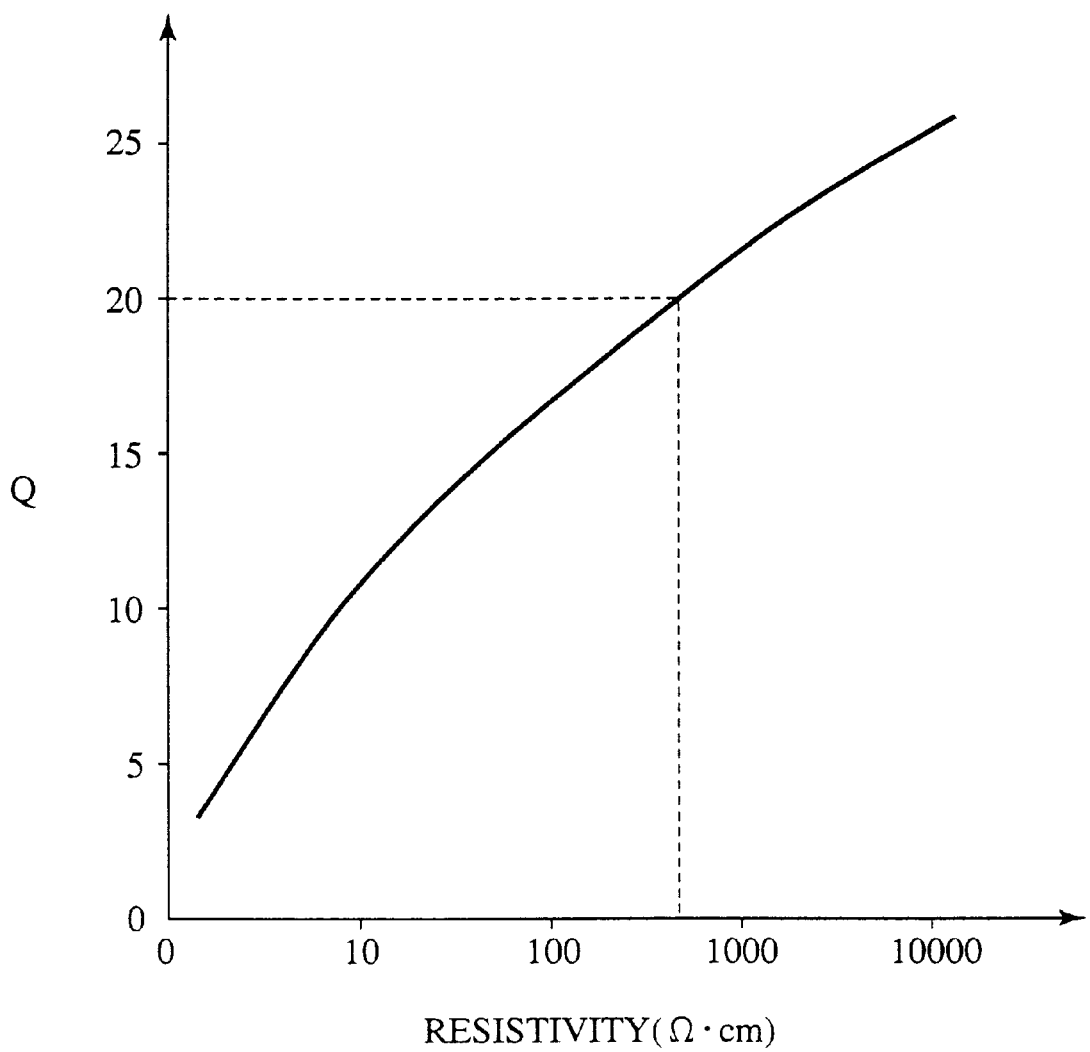
FIG. 2 is a graph of relationships between resistivities of a p type silicon substrate and Q of an inductor.

FIG. 2 is a graph of relationships between resistivities of a p type silicon substrate and Q of an inductor. As shown in FIG. 2, Q of the inductor tends to increase as a resistivity increases.

Based on this, a resistivity of the p type silicon substrate may be set high to increase Q of the inductor.

Figure 3:
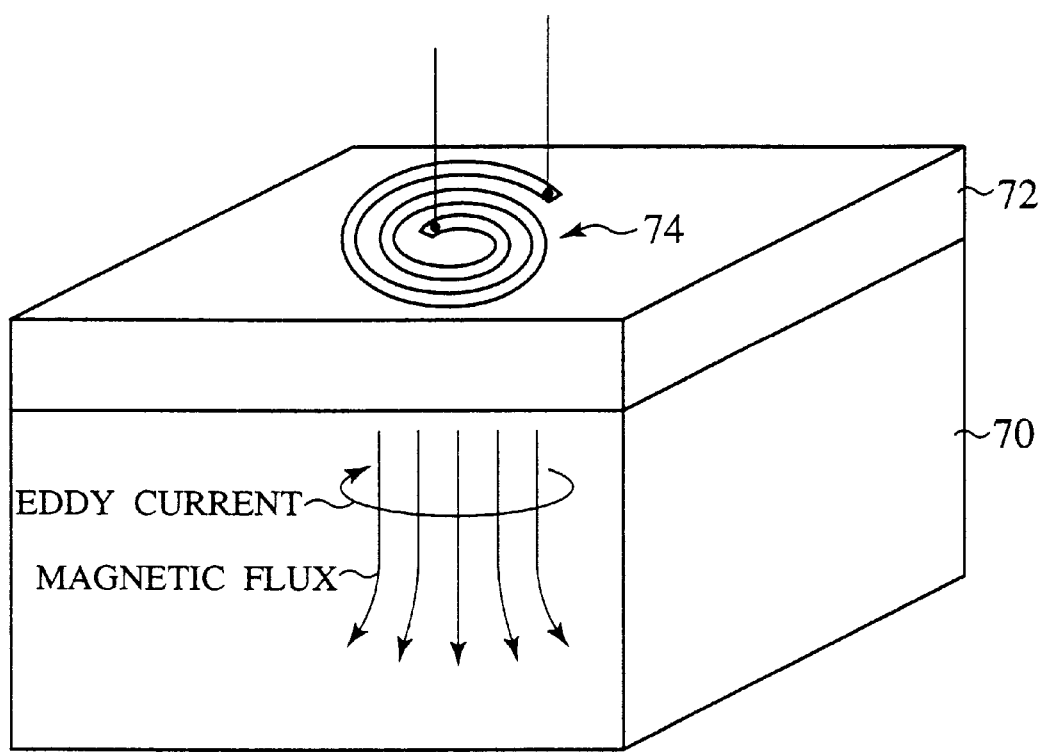
FIG. 3 is a conceptual view of a semiconductor device using a silicon substrate of high resistivity.

FIG. 3 is a conceptual view of a semiconductor device using a silicon substrate of high resistivity.

An inductor 74 is formed on a silicon substrate 70 of high resistivity through an insulation film 72 as shown in FIG. 3, whereby eddy current is small, and an eddy current loss can be small. Q of the inductor will be increased.

However, in a case that simply a resistivity of the p type silicon substrate 70 is set high, the conduction type of the silicon substrate 70 tends to change by thermal processing of about 450° C. which is made in the step of forming the inductor 74.

That is, generally a p type silicon substrate contains 10 $cm^{-3}$-order oxygen, and the thermal processing of about 450° C. made in the step of forming an inductor, etc. generates oxygen complex in the silicon substrates. The oxygen complex function as an n type dopant and are called a thermal donor or an oxygen donor. The phenomena of the thermal donor influencing the conduction type of the silicon substrate is called here a thermal donor phenomena.

Figure 12:
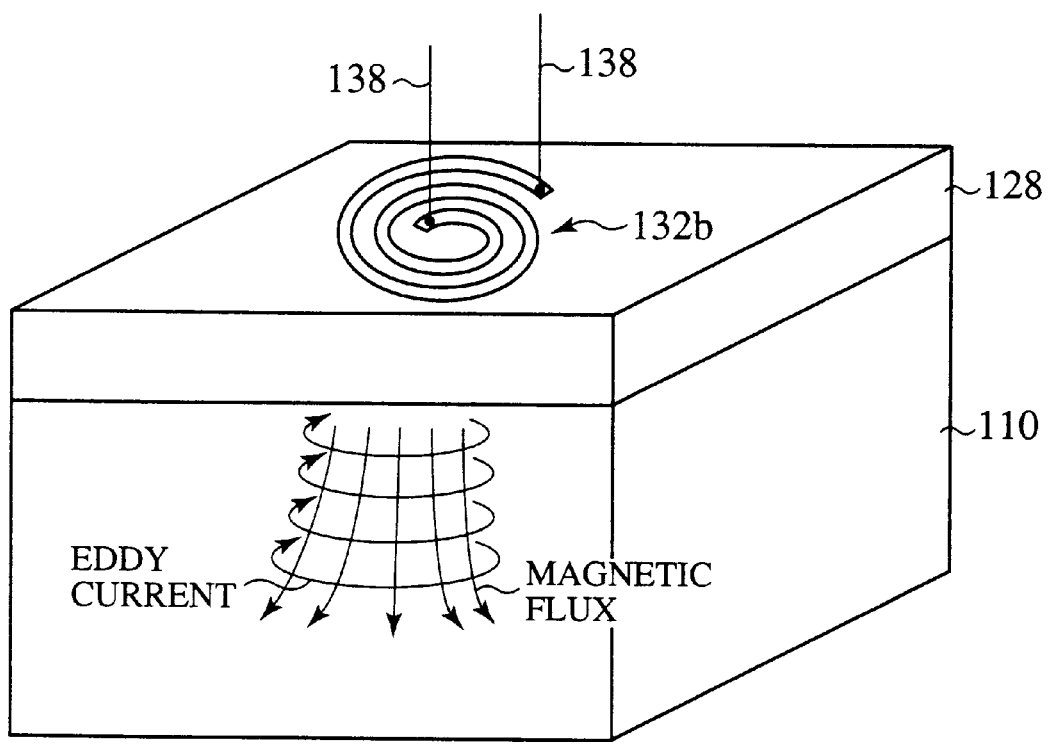
FIG. 12 is a conceptual view of the conventional semiconductor device
Figure 13:
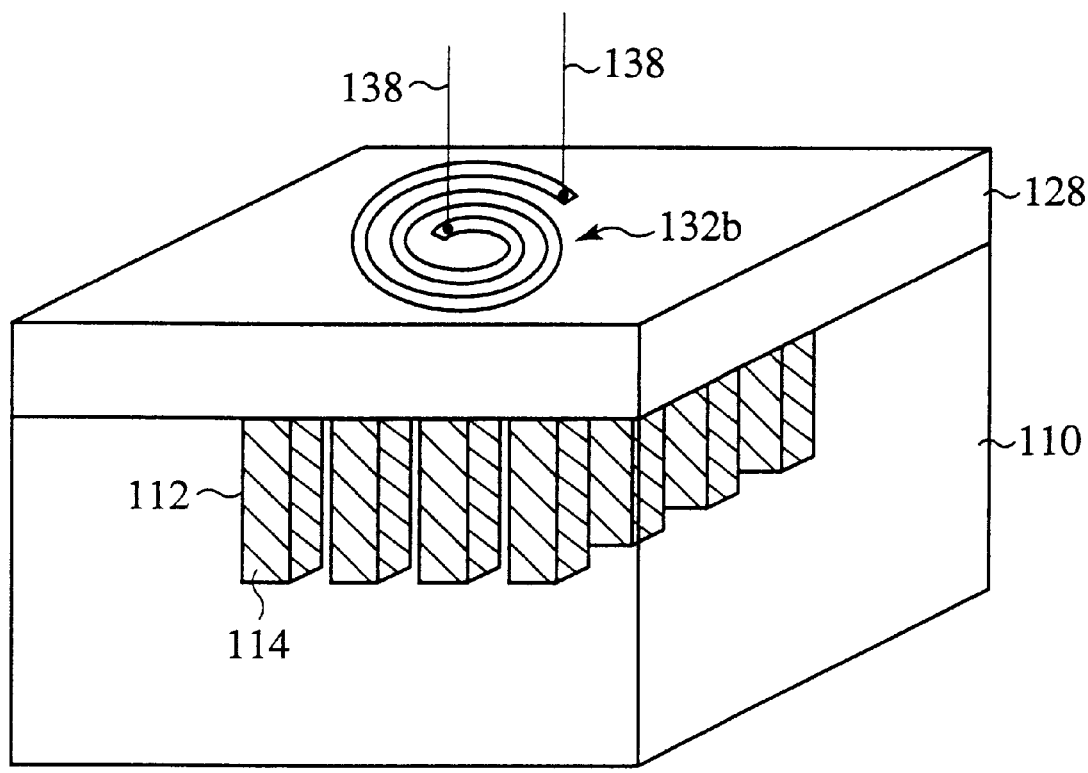
FIG. 13 is a conceptual view of the proposed semiconductor device.

In a case that in FIG. 12, an ordinary p type silicon substrate 110 of a 10 Ω·cm-resistivity and a $1.5 \times 10^{18}$ $cm^{-3}$ oxygen concentration is used, because of the high concentration of the p type dopant contained in the silicon substrate 110, the silicon substrate is invulnerable to the thermal donor phenomena. For example, the thermal processing of 450° C. which does not exceed 300 minutes does not convert the conduction type of the p type silicon substrate 110 to n conduction type.

In contrast to this, in a case that a p type silicon substrate of high resistivity is used, because of a low content of the p type dopant, the silicon substrate is vulnerable to the thermal donor phenomena. Accordingly, in a case that a resistivity of a p type silicon substrate 70 is simply set high to be, e.g., 100 Ω·cm, the thermal processing of 450° C. even for only 30 minutes converts the conduction type of the p type silicon substrate 70 to n conduction type. If the conduction type of the silicon substrate 70, which should be intrinsically p type, is converted to n type, various inconveniences, as of making device isolation difficult, etc., are caused to a semiconductor device fabrication process.

Then, the inventors of the present application have made earnest studies and found that an oxygen concentration of a silicon substrate is set low, whereby the conduction type of a p type silicon substrate is prevented from converting to n type, and a semiconductor device including an inductor of high Q can be provided.

That is, a p type silicon substrate of high resistivity, which has a low p type dopant content, is vulnerable to the thermal donor. However, an oxygen concentration of the silicon substrate is set low, whereby an amount of the thermal donor generated by the thermal processing can be made small, and the thermal donor phenomena can be made less influential to a conduction type of the silicon substrate.

Figure 4:
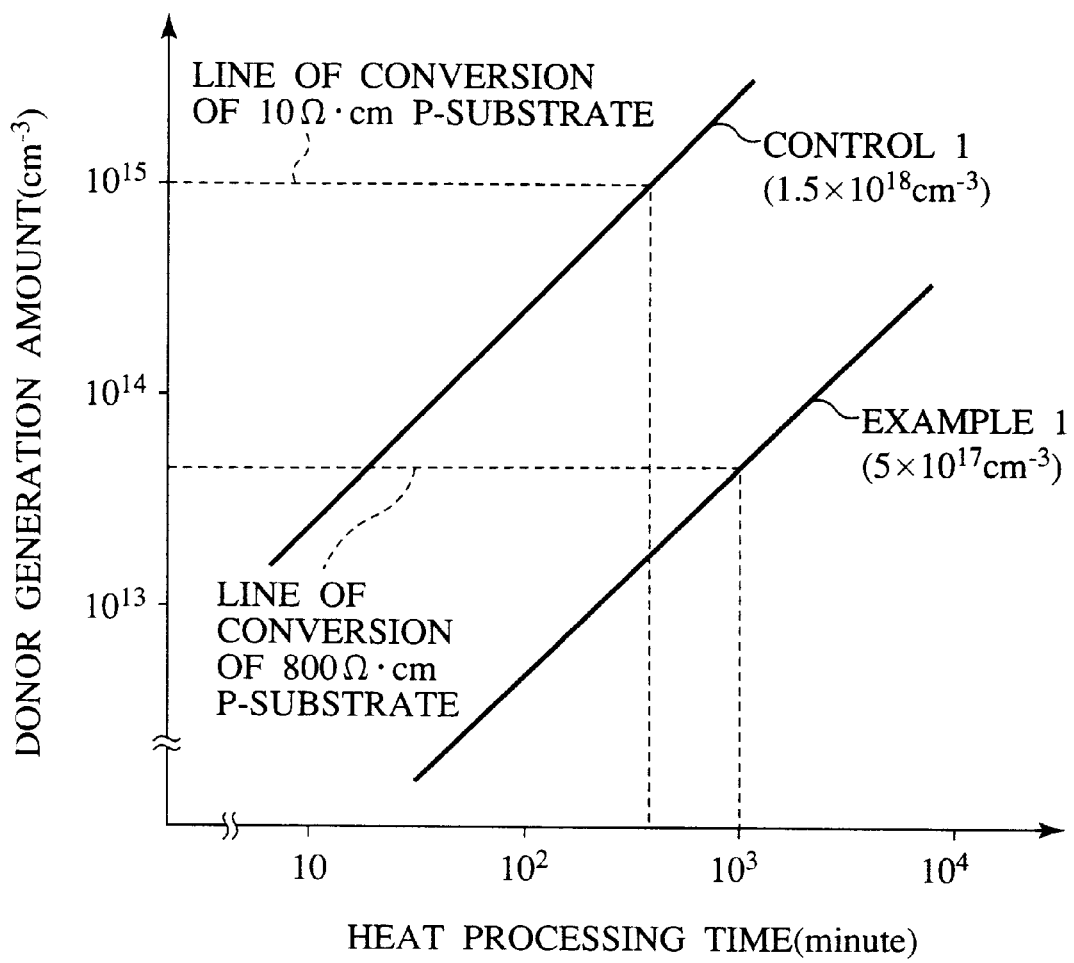
FIG. 4 is a graph of relationships between periods of the thermal processing and generation amounts of the thermal donors.

FIG. 4 is a graph of relationships between periods of thermal processing time and generation amounts of the thermal donor. Periods of the thermal processing time are taken on the horizontal axis, and generation amounts of the thermal donor are taken on the vertical axis. In Example 1, the silicon substrate is of low oxygen concentration, specifically a $5 \times 10^{17}$ $cm^{-3}$ oxygen concentration. In Control 1, the silicon substrate is an ordinary silicon substrate, specifically an about $1.5 \times 10^{18}$ $cm^{-3}$-oxygen content silicon substrate. In FIG. 4, the broken lines indicate lines where the conduction type of the p type substrate converts to n type. In FIG. 4, the thermal processing temperature is 450° C.

As shown in Control 1, the ordinary silicon substrate, which contains much oxygen, has a large generated amount of the thermal donor. However, in the ordinary silicon substrate, which has a low resistivity of 10 Ω·cm and much contains the p type dopant, the conduction type does not convert to n type unless the thermal donor is generated in an about $1 \times 10^{15}$ $cm^{-3}$. Accordingly, in the ordinary p type silicon substrate, a time in which the conduction type converts to n-type can be as long as about 300 minutes.

In the p type silicon substrate of a 800 Ω·cm resistivity, which contains only a small amount of the p type dopant, when the thermal donor is generated in an amount of about $6 \times 10^{13}$ $cm^{-3}$, the conduction type of the p type silicon substrate converts to n conduction type. However, by setting an oxygen concentration in the p type silicon substrate to be as low as $5 \times 10^{17}$ $cm^{-3}$, a generation amount of the thermal donor can be made small, as in Example 1. Thus, in a p type silicon substrate having a low oxygen concentration, even when a resistivity is as high as 800 Ω·cm, a time in which the conduction type converts to n type can be as long as about 1000 minutes.

As described above, according to the present invention, an oxygen concentration in a p type silicon substrate is set low, whereby even when the p-silicon substrate has a high resistivity, the p type silicon substrate is invulnerable to the thermal donor phenomena. Accordingly, according to the present invention, the conduction type of a p type silicon substrate is prevented from converting to n type, and can provide a semiconductor device having an inductor of high Q.

(Semiconductor Device)

Figure 1A:
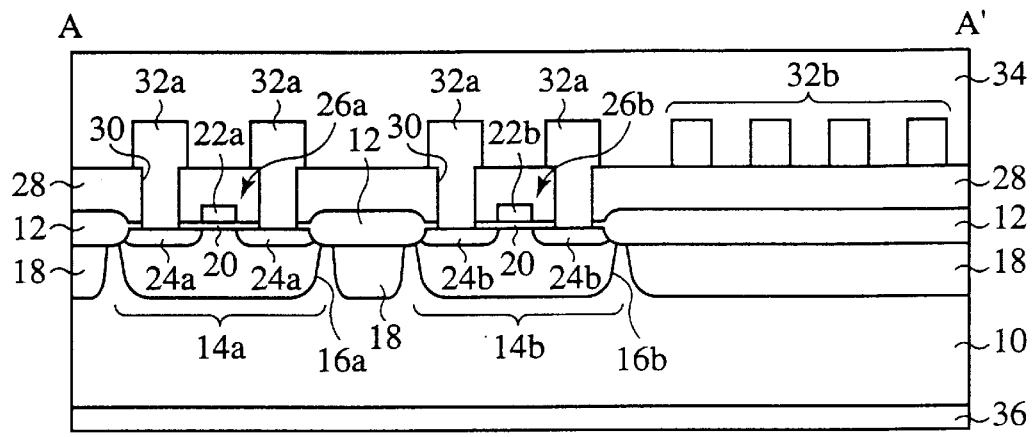
FIGS. 1A and 1B are sectional views of the semiconductor device according to a first embodiment of the present invention.
Figure 1B:
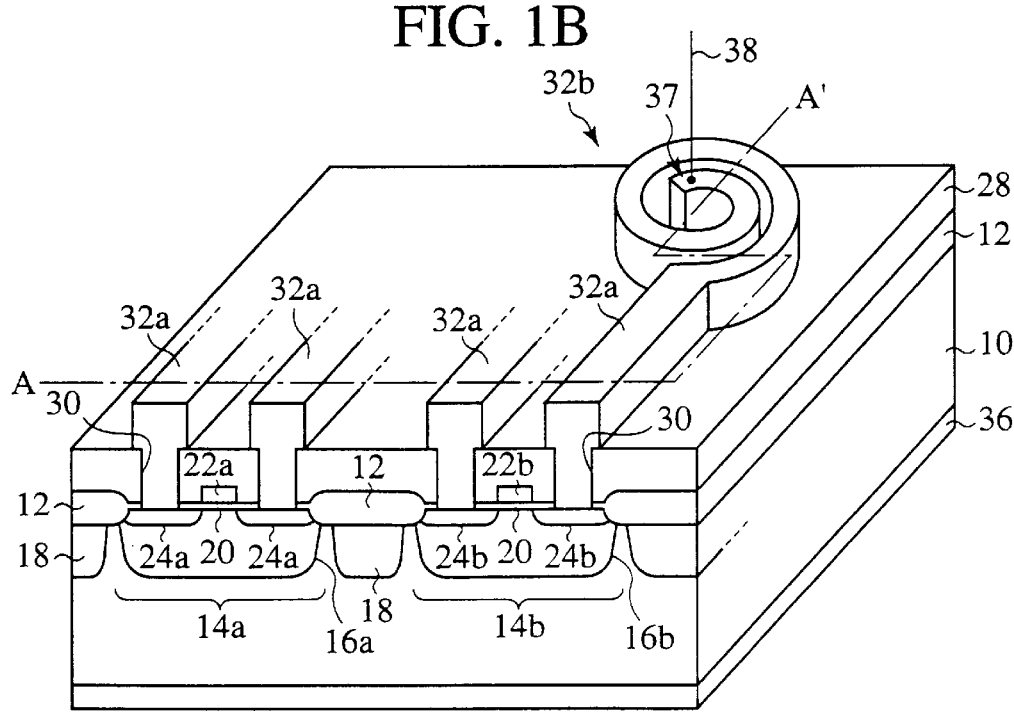

The semiconductor device according to a first embodiment of the present invention will be explained with reference to FIGS. 1A and 1B. FIGS. 1A and 1B are sectional views of the semiconductor device according to the first embodiment of the present invention.

As shown in FIGS. 1A and 1B, an device isolation film 12 is formed on the surface of a (100) oriented p type silicon substrate 10 of a 800 Ω·cm resistivity and a $5\times10^{17}$ cm$^{-3}$ oxygen concentration, defining device regions 14a, 14b.

A resistivity of the silicon substrate 10 is not limited to 800 Ω·cm and can be suitably set so that Q of the inductor can be a required high value. A resistivity can be set in a range of, e.g., 800 to 3000 Ω·cm.

A concentration of oxygen contained in the silicon substrate 10 is not limited to $5\times10^{17}$ cm$^{-3}$ and can be suitably set so that the thermal donor phenomena is less influential. An oxygen concentration of the silicon substrate 10 can be set to be below, e.g., $5\times10^{17}$ cm$^{-3}$.

In the device region 14a defined by the device isolation film 12 on the left side of the drawing, an n type well 16a is formed. In the device region 14b defined by the device isolation film 12 at the center of the drawing, a p type well 16b is formed.

A channel stop region 18 is formed on the silicon substrate 10 around the device regions 14a, 14b. In the present embodiment, the channel stop region 18 is formed for the following reason.

That is, in the semiconductor device according to the present embodiment, the resistivity of the silicon substrate 10 is such high that a depletion layer tends to spread, and the conduction type tends to convert in the surface of the substrate. Accordingly, the device isolation film 12 alone cannot always isolate the devices without failure. Then, in the present embodiment, the channel stop region 18 having a p type dopant concentration than the silicon substrate 10 is formed in the silicon substrate 10 at least around the device regions 14a, 14b, whereby the disadvantage of using the silicon substrate 10 having the high resistivity is prevented.

A gate insulation film 20 is formed on the silicon substrate 10 with the device isolation film 12 formed on. A gate electrode 22a of a polysilicon film doped with a high concentration of a p type impurity formed on the gate insulation film 20 of the device isolation region 14a. A source/drain diffused region 24a doped with a p type impurity is formed in the n type well 16a on both sides of the gate electrode 22a. Thus, a p-MOSFET 26a including the gate electrode 22a and the source/drain diffused region 24a formed in the device region 14a.

A gate electrode 22b of a polysilicon film with a high concentration of an n type dopant incorporated in is formed on the gate insulation film 20 in the device region 14b. A source/drain diffused region 24b with an n type dopant incorporated in is formed in the p type well 16b on both sides of the gate electrode 22b. Thus, in the device region 14b at the center of the drawing, an n type MOSFET 26b including the gate electrode 22b and the source/drain diffused region 24b is formed.

A planarization film 28 of PSG (Pphospho-Silicate Glass) is formed on the entire surface. The planarization film 28 makes the entire substrate flat.

Contact holes 30 are formed in the planarization film 28 down to the source/drain diffused regions 24a, 24b.

An interconnection 32a and an inductor 32b are formed of Al on the planarization film 28 with the contact holes 30 formed in. The inductor 32b is electrically connected through the interconnection 32a the source/drain diffused region 22b of the p-channel MOSTFET 26a and the source/drain diffused region 24b of the n-channel MOSFET 26b.

A cover film 34 of PSG is formed on the planarization film 28 with the interconnection 32a and the inductor 32b formed on.

An opening (not shown) is formed in the cover film 34 down to a bonding pad 37 of the inductor 32b.

The inductor 32b is connected to a bonding wire 38 at the bonding pad 37.

A polysilicon film 36 which functions as a gettering site) is formed on the underside of the silicon substrate 10. Here, the gettering site means a region for trapping metal impurities.

In the general silicon substrates, which have high oxygen concentrations, can trap metal impurities by oxygen precipitation. However, in the semiconductor device according to the present embodiment, the oxygen concentration of the silicon substrate 10 is low, and it is difficult to trap the metal impurities by oxygen precipitation. Then, in the semiconductor device according to the present embodiment, the polysilicon film 36 which functions as the gettering site is formed on the underside of the silicon substrate 10 so as to trap the metal impurities. Thus, deterioration of characteristics of the MOSFET, etc. due to the metal impurities can be prevented.

The semiconductor device according to the present embodiment has such constitution.

Figure 5:
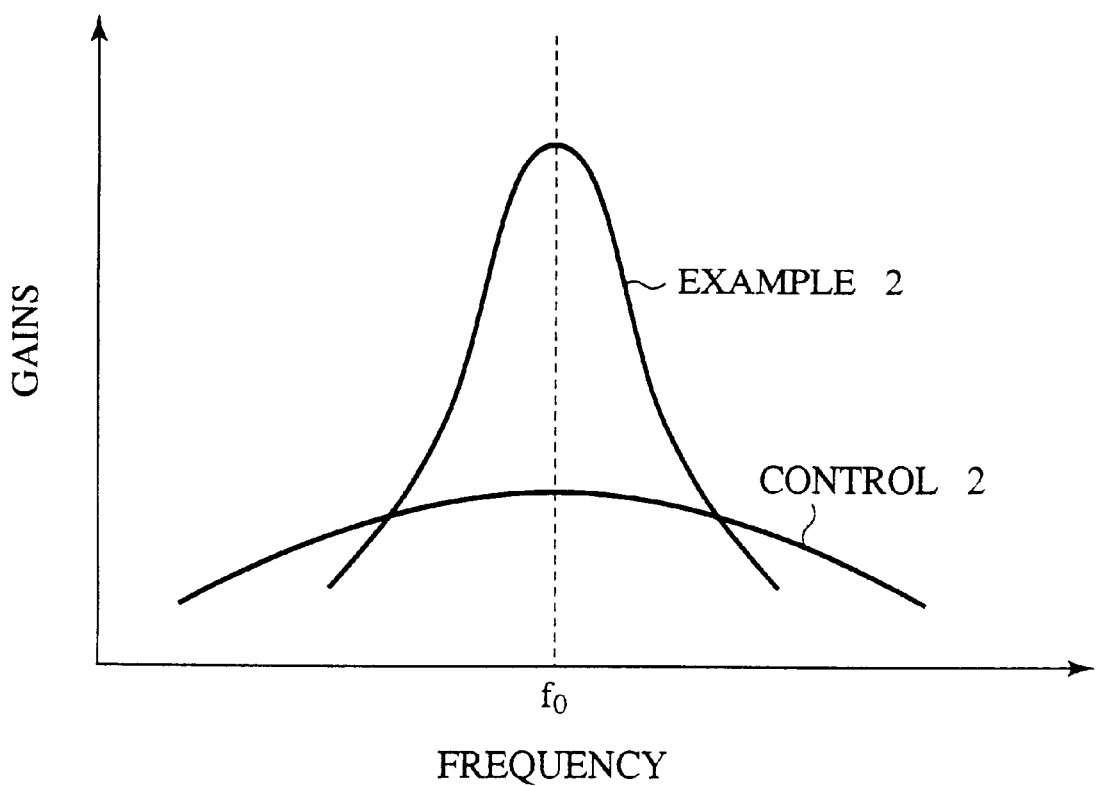
FIG. 5 is a graph of resonance characteristics of the semiconductor device according to a first embodiment of the present invention.

FIG. 5 is a graph of resonance characteristics of the semiconductor device according to the present embodiment. Frequencies are taken on the horizontal axis. Gains are taken on the vertical axis. Example 2 indicates resonance characteristics of the semiconductor device according to the present embodiment. Control 2 indicates resonance characteristics of the conventional semiconductor device shown in FIG. 12.

As shown in FIG. 5, Example 2, i.e., the semiconductor device according to the present embodiment has sharper resonance characteristics than Control 2, i.e., the conventional semiconductor device. This shows that the semiconductor device according to the present embodiment has lower eddy current loss and inductance of higher Q.

As described above, according to the present embodiment, a concentration of oxygen in the silicon substrate is set low to make the silicon substrate invulnerable to the thermal donor phenomena, whereby even when a p type silicon substrate of high resistivity is used, the conduction of the p type silicon substrate is prevented from converting to n type. Thus, according to the present embodiment, the conduction type of the p type silicon substrate to n type is prevented, and the semiconductor device can have an inductance of high Q.

According to the present embodiment, a polysilicon film which functions as the gettering site is formed on the underside of the silicon substrate, whereby even when the silicon substrate has a low oxygen concentration, metal impurities can be trapped. Accordingly, even when the silicon substrate has a low oxygen concentration, characteristic deterioration of the semiconductor device can be prevented.

(Method for Fabricating the Semiconductor Device)

Next, the method for fabricating the semiconductor device according to the present embodiment will be explained with reference to FIGS. 6A to 8C. FIGS. 6A to 8C are sectional views of the semiconductor device according to the present embodiment in the steps of the method for fabricating the semiconductor device, which show the method. In FIGS. 6A to 8C, the left side of the drawing is a region 40a where the p-channel MOSFET is to be formed, the center of the drawing is a region 40b where the n-channel MOSFET is to be formed, and the right side of the drawing is a region 40c where the inductor is to be formed.

First, a (100) oriented p type silicon substrate 10 of a 800 Ω·cm resistivity and a $5 \times 10^{17}$ cm$^{-3}$ oxygen concentration with the polysilicon film 36 formed in a 1 μm-thickness on the underside is prepared.

A resistivity of the silicon substrate 10 is not limited to 800 Ω·cm and can be suitably set so that Q of the inductor can have a high value. A resistivity can be set in a range of, e.g., 800 to 3000 Ω·cm.

A concentration of oxygen contained in the silicon substrate 10 is not limited to $5 \times 10^{17}$ cm$^{-3}$ and can be suitably set so that the conduction type of the silicon substrate 10 is prevented from converting to n type by the thermal donor phenomena. An oxygen concentration of the silicon substrate 10 can be set suitably below $5 \times 10^{17}$ cm$^{-3}$.

Then, the device isolation film 12 for defining the device regions 14a, 14b is formed on the surface of the silicon substrate 10 by LOCOS (LOCal Oxidation of Silicon). At this time, the p$^+$type channel stop region 18 is also formed.

Next, P, which is an n type dopant, is implanted in the device region 14a to form the n type well 16a. Conditions for the ion implantation are, e.g., 80 keV and $7 \times 10^{12}$ cm$^{-2}$.

Then, B, which is a p type dopant, is implanted in the device region 14b by ion implantation to form the p type well 16b. Conditions for the ion implantation are, e.g., 120 keV and $2 \times 10^{13}$ cm$^{-2}$. Then, heat processing of 1200° C. and 120 minutes follows.

Figure 6A:
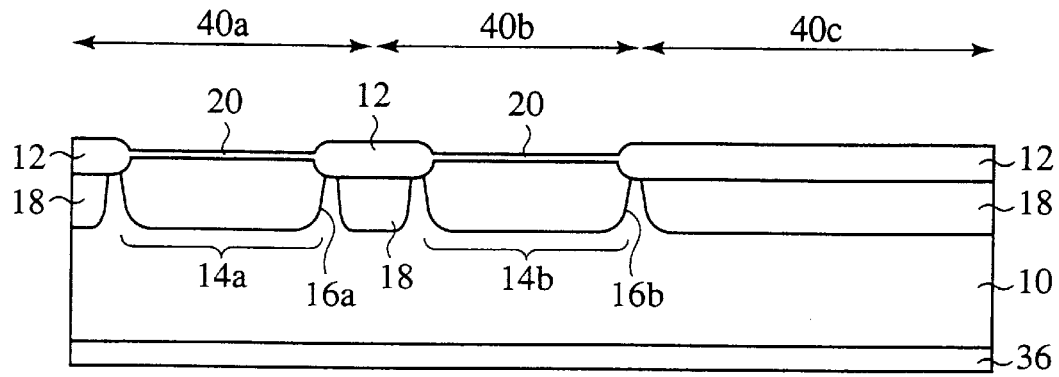
FIGS. 6A to 6C are sectional views of the semiconductor device according to the first embodiment of the present invention in the steps of the method for fabricating the semiconductor device, which show the method (Part 1).

Next, the gate insulation film 20 is formed by thermal oxidation on the silicon substrate 10 with the device isolation film 12 formed on (see FIG. 6A).

Figure 6B:
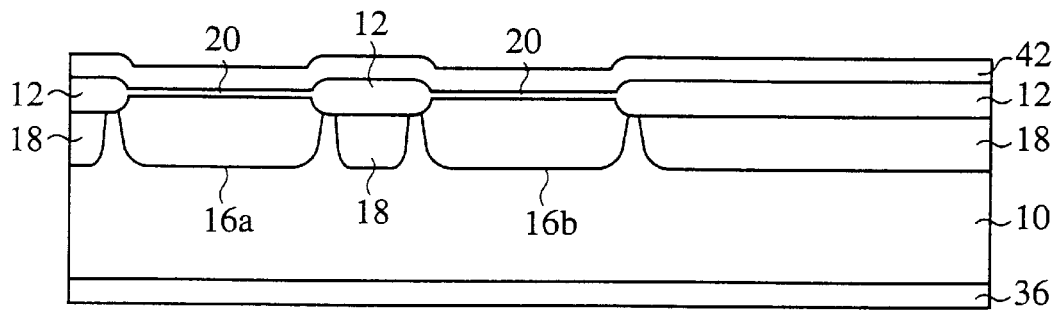
Figure 6C:
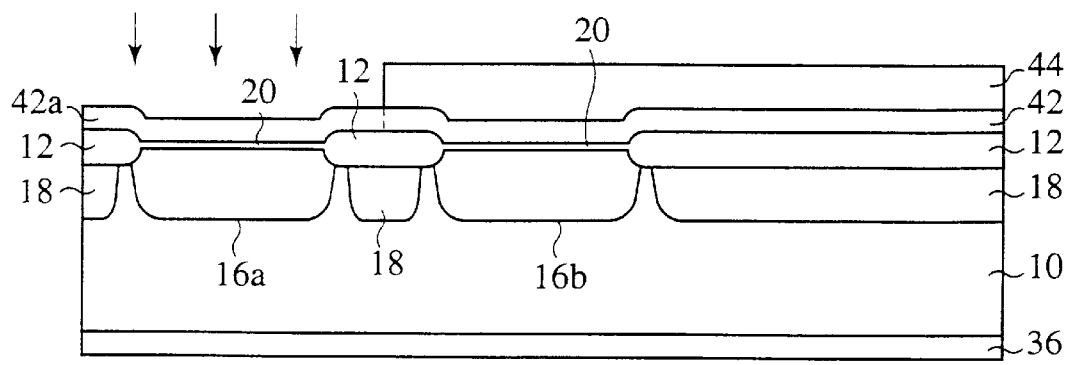
Figure 7A:
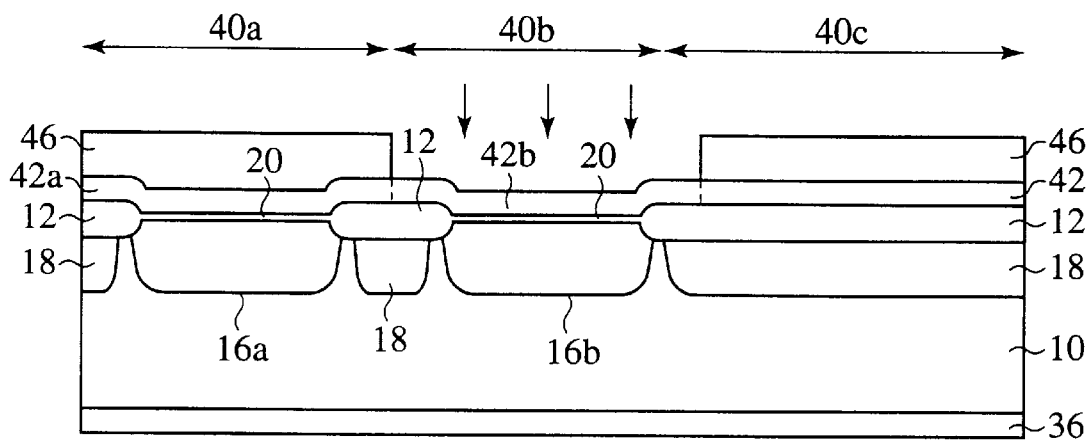
FIGS. 7A to 7C are sectional views of the semiconductor device according to the first embodiment of the present invention in the steps of the method for fabricating the semiconductor device, which show the method (Part 2).
Figure 7B:
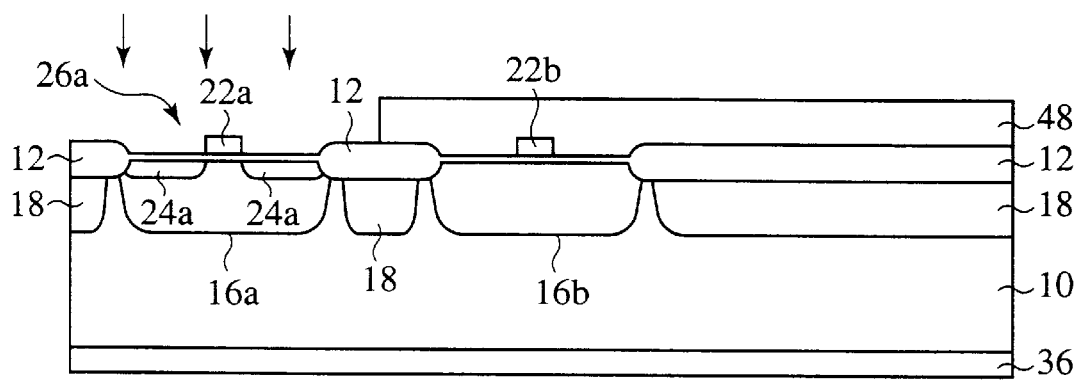
Figure 7C:
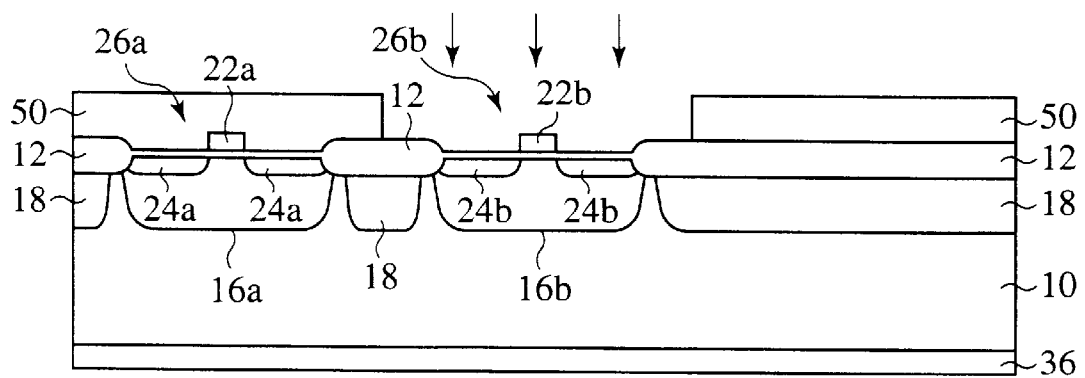

Then, the polysilicon film 42 is formed in a 400 nm-thickness on the entire surface by CVD (see FIG. 6B).

Then, with a photoresist mask 44, as a mask, for covering the region 40b for the n-channel MOSFET to be formed in and the region 40c for the inductor to be formed in, an n type dopant, e.g., P ions are implanted, and an n type dopant is implanted in the polysilicon film 42 in the region 40a for the p-channel MOSFET to be formed in. Conditions for the ion implantation are, e.g., 50 keV and $1 \times 10^{16}$ cm$^{-2}$. Thus, the polysilicon film 42a with the n type dopant incorporated in is formed (see FIG. 6C).

Then, with a photoresist mask, as a mask, for covering the region 40a for the p-channel MOSFET to be formed in and the region 40c for the inductor to be formed in, an n type dopant, e.g., P ions are implanted, and an n type dopant is implanted in the polysilicon film 42 in the region 40b for the n-channel MOSFET to be formed in. Thus, the polysilicon film 42b with the n type dopant incorporated in is formed (see FIG. 7A).

Next, the polysilicon films 42, 42a, 42b are patterned by photolithography to form the gate electrodes 22a, 22b of the polysilicon.

Next, with a photoresist mask 48, as a mask, for covering the region 40b for the n-channel MOSFET to be formed in and the region 40c for the inductor to be formed in, a p type dopant, e.g., B ions are implanted by self-alignment with the gate electrode 22a. Conditions for the ion implantation are, e.g., BF$_2^+$ ions, 40 keV and $1.5 \times 10^{15}$ cm$^{-2}$. The source/drain diffused region 22a is thus formed in the n type well 16a on both sides of the gate electrode 22a. Thus, the p-channel MOSFET 26a including the gate electrode 22a and the source/drain diffused region 24a is formed (see FIG. 7B)

Next, with a photoresist 50, as a mask, for covering the region 40a for the p-channel MOSFET to be formed in and the region 40c for the inductor to be formed in, an n type dopant, e.g., As (Arsenic) ions are implanted by self-alignment with the gate electrode 22b. Conditions for the ion implantation are, e.g., 80 keV and $2 \times 10^{15}$ cm$^{-2}$. The source/drain diffused region 24b is thus formed in the p type well 16b on both sides of the gate electrode 22b. Thus, the n-channel MOSFET 26b including the gate electrode 22b and the source/drain diffused region 24b is formed (see FIG. 7C).

Next, the PSG film is formed in a 800 nm-thickness on the entire surface by CVD. Then, thermal processing of 1000° C. and 10 minutes is made to reflow the PSG film. The planarization film 28 is thus formed of the PSG. The thermal processing diffuses the dopants of the source/drain diffused regions 24a, 24b.

Figure 8A:
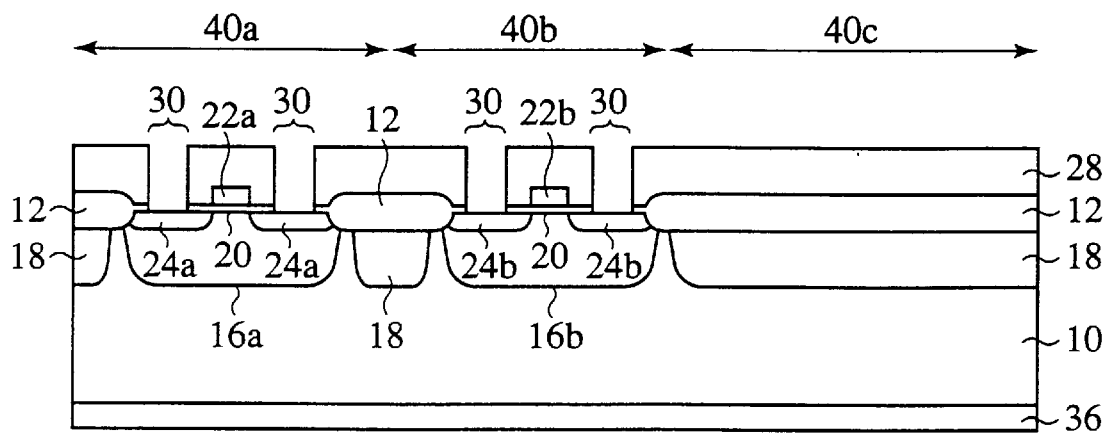
FIGS. 8A to 8C are sectional views of the semiconductor device according to the first embodiment of the present invention in the steps of the method for fabricating the semiconductor device, which show the method (Part 3).

Then, the contact holes 30 are formed by photolithography in the planarization film 28 down to the source/drain diffused regions 24a, 24b (see FIG. 8A).

Figure 8B:
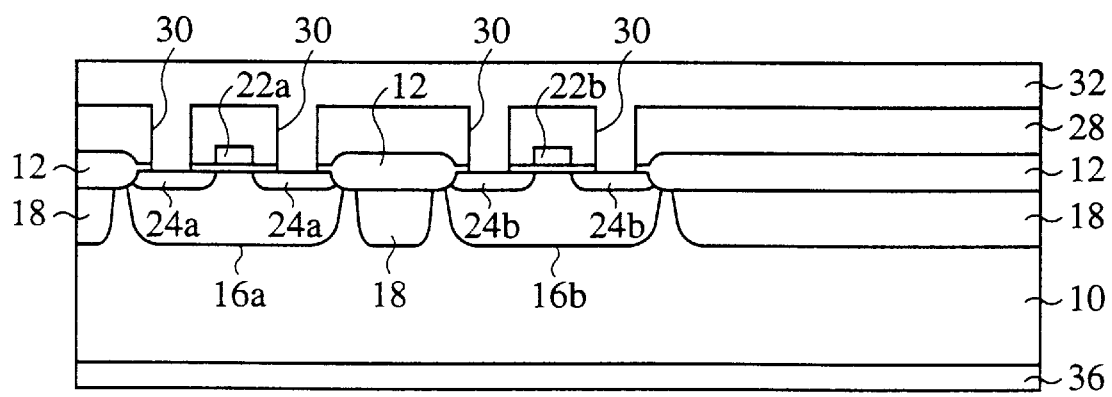

Next, a 1 μm-thickness aluminum film 32 is formed on the entire surface by sputtering (see FIG. 8B).

Then, the aluminum film 32 is patterned by photolithography to form the interconnection 32a and the inductor 32b of the aluminum.

Next, the cover film 34 is formed of an 1 μm-thickness PSG film on the entire surface by CVD.

Then, the opening (not shown) is formed in the cover film 34 down to the bonding pad 37 (see FIG. 1B). Then, the bonding wire 38 is connected to the bonding pad 37.

Figure 8C:
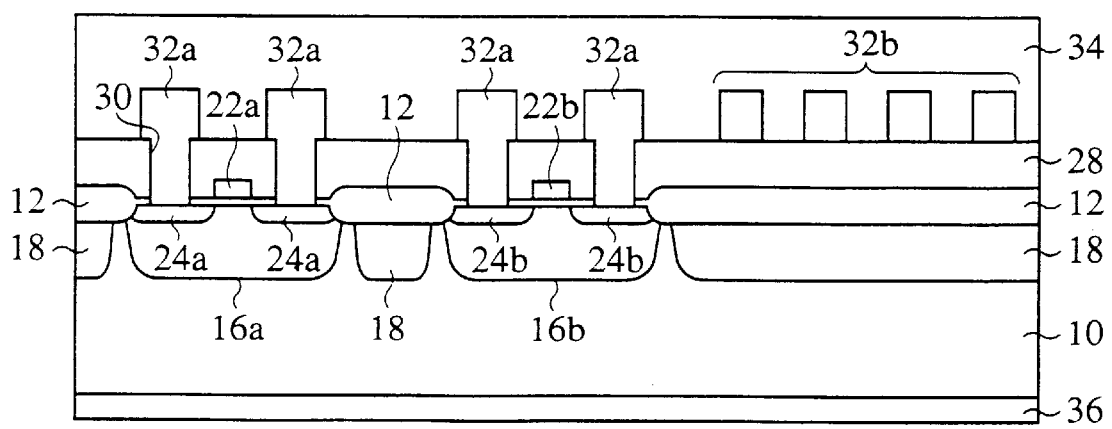

Thus, the semiconductor device according to the present embodiment is fabricated (see FIG. 8C).

As described above, according to the present embodiment, it is not necessary to bury a highly resistive layer in the silicon substrate, which permits the semiconductor device including the inductor of high Q to be fabricated in the simple steps. This contributes to cost reduction of the semiconductor device.

A Second Embodiment

Figure 9:
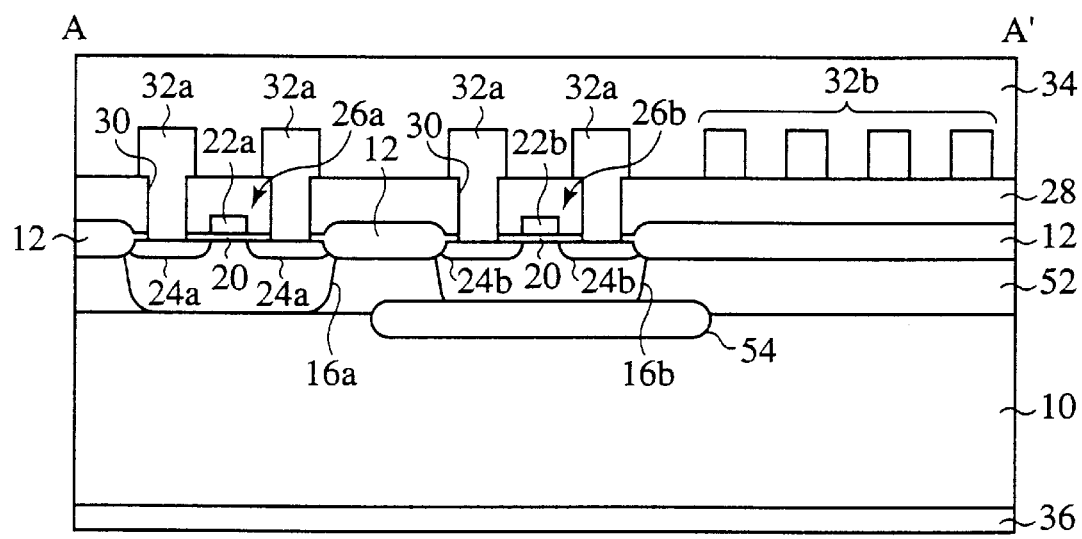
FIG. 9 is a sectional view of the semiconductor device according to a second embodiment of the present invention.

The semiconductor device according to a second embodiment of the present invention and the method for fabricating the semiconductor device will be explained with reference to FIGS. 9 to 10C. FIG. 9 is a sectional view of the semiconductor device according to the present embodiment. FIGS. 10A to 10C are sectional views of the semiconductor device according to the present embodiment in the steps of the method for fabricating the semiconductor device, which show the method. The same members of the present embodiment as those of the first embodiment are represented by the same reference numbers not to repeat or to simplify their explanation.

The semiconductor device according to the present embodiment and the method for fabricating the semiconductor device are characterized in that an epitaxial layer 52 is formed on a p type silicon substrate 10.

As shown in FIG. 9, the epitaxial layer 52 of n type silicon is formed on the silicon substrate 10.

An n$^+$type buried diffused layer 54 is formed near the interface between the silicon substrate 10 and the epitaxial layer 52 and near the region where a p type well 16b is formed.

According to the present embodiment, the epitaxial layer 52 formed on the silicon substrate 10 more facilitates the device isolation in comparison with the device isolation in the semiconductor device according to the first embodiment including the p-channel MOSFET 26a and the n-channel MOSFET 26b formed directly on the silicon substrate 10.

That is, in the semiconductor device according to the first embodiment, in which the p-channel MOSFET 26a and the n-channel MOSFET 26b are formed directly on the silicon substrate 10, it is not always easy to isolate the devices only by the device isolation film 12. In order to ensure the device isolation, the channel stop region 18 must be formed.

In contrast to this, in the present embodiment, the p-channel MOSFET 26a and the n-channel MOSFET 26b are formed on the epitaxial layer 52, which can facilitate the device isolation without forming the channel stop region 18. That is, the n type epitaxial layer 52 must not be highly resistive, as must be the silicon substrate 10, and the device isolation can be performed easily without forming the channel stop region 18.

Then, the method for fabricating the semiconductor device according to the present embodiment will be explained with reference to FIGS. 10A to 10C.

Figure 10A:
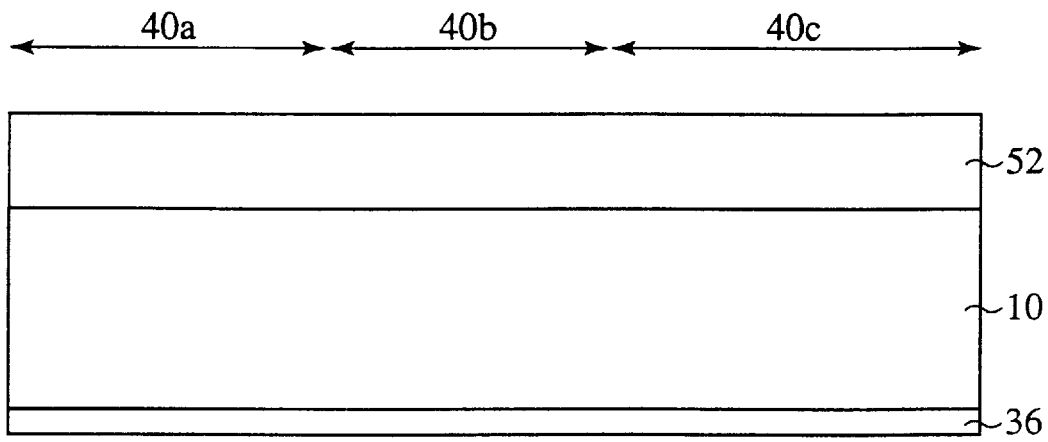
FIGS. 10A to 10C are sectional views of the semiconductor device according to the second embodiment of the present invention in the steps of the method for fabricating the semiconductor device, which show the method.
Figure 10B:
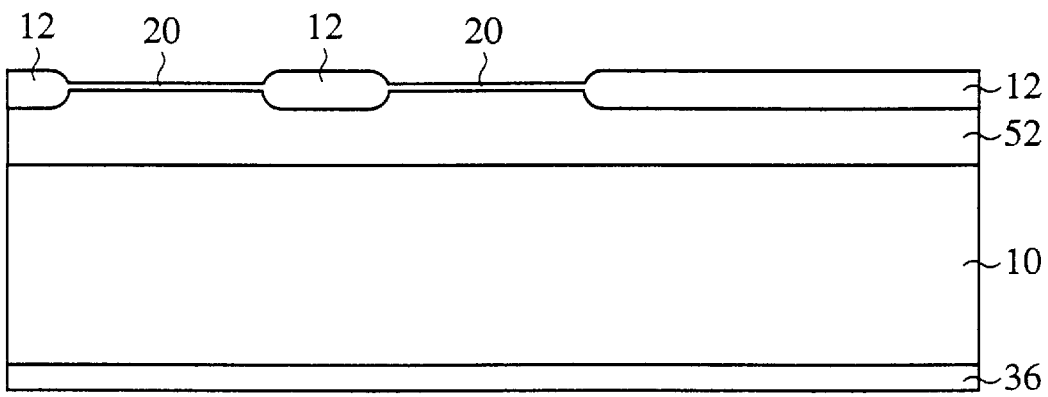
Figure 10C:
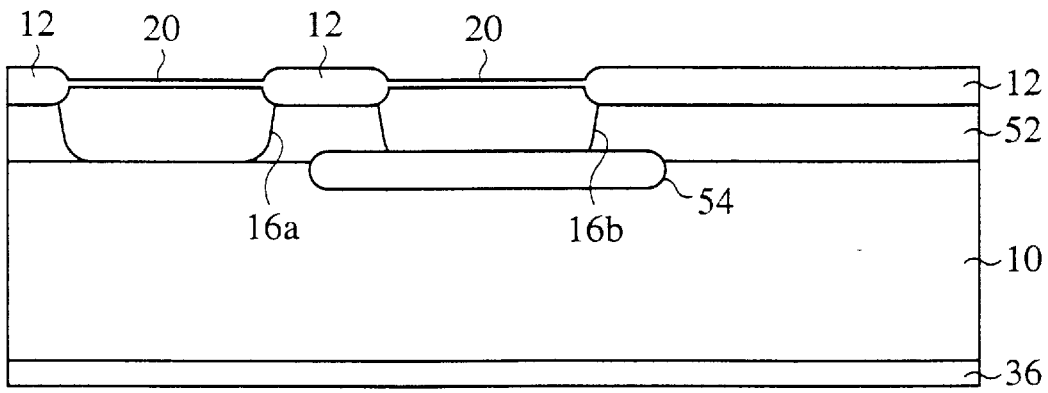

As shown in FIG. 10A, first, a (100) oriented p type silicon substrate 10 of a 800 Ω·cm resistivity and a $5 \times 10^{17}$ cm$^{-3}$ oxygen concentration with the polysilicon film 36 formed in a 1 μm-thickness on the underside is prepared.

Then, the epitaxial layer 52 of n type silicon is formed on the p type silicon substrate 10 by low-pressure CVD (see FIG. 10A).

Then, in the same was as in the method for fabricating the semiconductor device according to the first embodiment shown in FIG. 6A, the device isolation film 12 and the gate insulation film 20 are formed.

Next, with a photoresist mask as a mask for opening the region 40b for the n-channel MOSFET to be formed in, Sb (antimony), an n-dopant is ion-implanted heavily in, e.g., a $3.5 \times 10^{15}$ cm$^{-2}$ to form the n type buried diffused layer 54. Conditions for the ion implantation are, e.g., Sb$^+$ ions, 70 keV and $3.5 \times 10^{15}$ cm$^{-2}$.

Then, in the same was as in the method for fabricating the semiconductor device according to the first embodiment shown in FIG. 6A, the n type well 16a and the p type well 16b are formed.

The following steps of the semiconductor fabrication method according to the present embodiment are the same as those of the method for fabricating the semiconductor device according to the first embodiment shown in FIGS. 6A to 8C, and their explanation is omitted.

Thus, the semiconductor device according to the present embodiment is fabricated.

As described above, according to the present embodiment, the epitaxial layer is formed on the silicon substrate,, and the p-channel MOSFET and the n-channel MOSFET are formed on the epitaxial layer, whereby the device isolation can be easily performed without forming the channel stop region.

Modifications

The present invention is not limited to the above-described embodiments and can cover other various modifications.

For example, although the above-described embodiments have been explained by means of semiconductor devices of CMOS structure including the p-channel MOSFET and n-channel MOSFET, the present invention is not limited to semiconductor devices of CMOS structure and is applicable to semiconductor devices of any structure including inductors. For example, the present invention is applicable to all semiconductor devices, such as semiconductor devices including n-channel MOSFETS, semiconductor devices including p-channel MOSFETs, semiconductor devices including BiCMOS structure, etc. The present invention is applicable also to light emitting devices, such as CCD (Charge Coupled Device), etc., semiconductor devices for electric power, and others.

Figure 11:
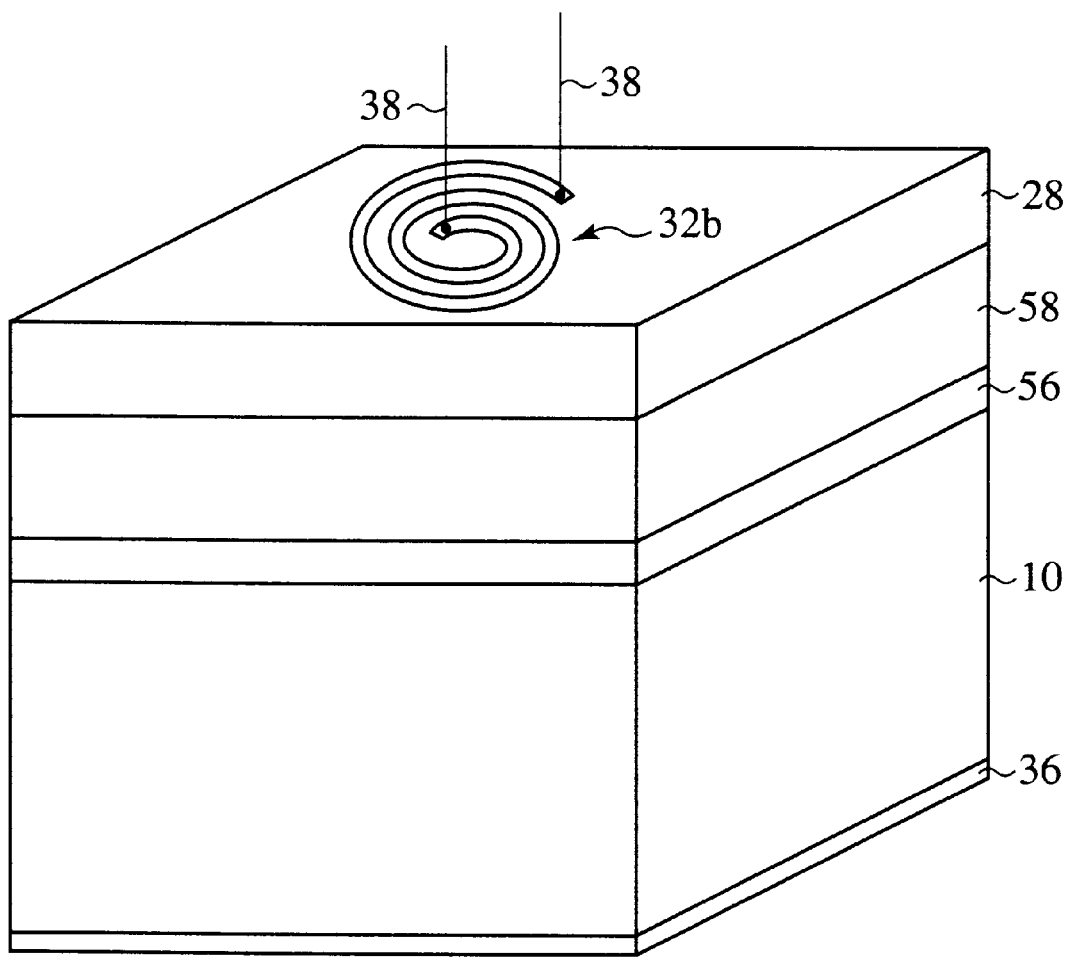
FIG. 11 is a conceptual view of the semiconductor device according to a modification of the present invention.

The present invention is applicable also to cases that SOI (Silicon On Isulator) substrates are used. FIG. 11 is a diagrammatic view of a semiconductor device using an SOI substrate. As shown in FIG. 11, an inductor 32b is formed through a planarization film 28 on an SOI substrate formed of a silicon substrate 10, a silicon oxide film 56 and a silicon layer 68. Also in such case that the SOI substrate is used, a semiconductor device including the inductor of high Q can be provided.

In the above-described embodiments, the p type silicon substrates 10 are used, but p type silicon substrates may not be essentially used. The present invention is applicable to cases that n type silicon substrates and i type silicon substrates are used. That is, silicon substrates having low oxygen concentrations are used, whereby the thermal donor phenomena can be made less influential, and semiconductor devices having stable characteristics can be provided.

In the above-described embodiments, the polysilicon film 36 as the gettering site is formed on the underside of the silicon substrate, but the gettering site is not essentially the polysilicon film 36, and all other gettering sites can be used. For example, the underside of the silicon substrate 10 is polished to form the gettering site.

In the above-described embodiments, the inductor is formed on the silicon substrate through the insulation film. However, the inductor may not be formed essentially through the insulation film, and various constitutions forming the inductor of high Q can be used.

What is claimed is:

1. A semiconductor device comprising:
   a silicon substrate of a resistivity above or equal to 800 Ω·cm and an oxygen concentration under or equal to $5 \times 10^{17}$ cm$^{-3}$; and
   an inductor formed above the silicon substrate.

2. A semiconductor device according to claim 1, further comprising:
   a well formed in a first region of the silicon substrate;
   a gate electrode formed above the well through a gate insulation film; and
   a source/drain diffused region formed in the well and on both sides of the gate electrode, at least either of the source and the drain being electrically connected to the inductor.

3. A semiconductor device according to claim 2, further comprising
   a channel stop region formed in the silicon substrate and near the first region.

4. A semiconductor device according to claim 1, further comprising:
   a first semiconductor layer formed on the silicon substrate;
   a well formed in a first region of the first semiconductor layer;
   a gate electrode formed above the well through a gate insulation film; and
   a source/drain diffused region formed in the well and on both sides of the gate electrode, at least either of the source and the drain being electrically connected to the inductor.

5. A semiconductor device according to claim 1, wherein the silicon substrate further includes a gettering region for trapping metal impurities.

6. A semiconductor device according to claim 2, wherein the silicon substrate further includes a gettering region for trapping metal impurities.

7. A semiconductor device according to claim 4, wherein the silicon substrate further includes a gettering region for trapping metal impurities.

8. A semiconductor device according to claim 5, wherein the gettering region is a second semiconductor layer formed on the underside of the silicon substrate.

9. A semiconductor device according to claim 6, wherein the gettering region is a second semiconductor layer formed on the underside of the silicon substrate.

10. A semiconductor device according to claim 7, wherein the gettering region is a second semiconductor layer formed on the underside of the silicon substrate.

11. A semiconductor device according to claim 5, wherein the gettering region is formed by polishing the underside of the silicon substrate.

12. A semiconductor device according to claim 6, wherein the gettering region is formed by polishing the underside of the silicon substrate.

13. A semiconductor device according to claim 7, wherein the gettering region is formed by polishing the underside of the silicon substrate.

14. A method for fabricating a semiconductor device comprising:

the step of forming an inductor above a silicon substrate of a resistivity above or equal to 800 Ω·cm and an oxygen concentration under or equal to $5 \times 10^{17}$ cm$^{-3}$.

15. A method for fabricating a semiconductor device according to claim 14, wherein the silicon substrate further includes a gettering region for trapping metal impurities.

* * * * *